US007109707B2

(12) United States Patent
Griffin

(10) Patent No.: US 7,109,707 B2
(45) Date of Patent: Sep. 19, 2006

(54) COMPUTER READABLE MAGNETIC RESONANCE METHOD CALCULATING ON-LINE GRADIENTS DURING IMAGING

(75) Inventor: Mark Philip Griffin, Corinda Qld (AU)

(73) Assignee: University of Queensland, St. Lucia (AU)

( * ) Notice: Subject to any disclaimer, the term of this patent is extended or adjusted under 35 U.S.C. 154(b) by 396 days.

(21) Appl. No.: 10/408,443

(22) Filed: Apr. 8, 2003

(65) Prior Publication Data

US 2004/0204641 A1 Oct. 14, 2004

(51) Int. Cl.
*G01V 3/00* (2006.01)

(52) U.S. Cl. ...................... 324/307; 324/318

(58) Field of Classification Search ............... 324/306, 324/307, 309, 310, 312; 600/9, 407, 410, 600/420
See application file for complete search history.

(56) References Cited

U.S. PATENT DOCUMENTS

| 5,192,909 | A | * | 3/1993 | Hardy et al. | ............... 324/309 |
| 5,485,086 | A | | 1/1996 | Meyer | |
| 6,486,670 | B1 | * | 11/2002 | Heid | ........................ 324/307 |
| 6,487,435 | B1 | * | 11/2002 | Mistretta et al. | ............ 600/420 |
| 6,636,038 | B1 | * | 10/2003 | Heid | ........................ 324/314 |
| 6,671,536 | B1 | * | 12/2003 | Mistretta | .................... 600/410 |
| 2001/0026157 | A1 | * | 10/2001 | Heid | ........................ 324/312 |
| 2001/0027262 | A1 | * | 10/2001 | Mistretta et al. | ............... 600/9 |
| 2003/0060698 | A1 | * | 3/2003 | Mistretta | ...................... 600/410 |
| 2003/0191386 | A1 | * | 10/2003 | Heid | ........................ 600/410 |

(Continued)

FOREIGN PATENT DOCUMENTS

DE 102 14 736 A1 * 10/2003

(Continued)

OTHER PUBLICATIONS

Thulborn KR, Gindin TS, David D, et al. Comprehensive MR Imaging Protocol for Stroke Management: Tissue sodium concentration as a measure of tissue viability in nonhuman *Radiology* 1999;213:156-166.

(Continued)

*Primary Examiner*—Brij Shrivastav
*Assistant Examiner*—Tiffany A. Fetzner
(74) *Attorney, Agent, or Firm*—Paul Vincent

(57) ABSTRACT

A method and device of magnetic resonance imaging carry out the steps of selecting a trajectory in phase space; expressing that trajectory as a function of variables in a coordinate system suitable for driving gradient coils of an imaging system; performing variable transformation and redefinition to extract a subset of variables varying as a function of time along gradient wave forms but constant from projection to projection; calculating that subset of variables prior to imaging; storing that calculated subset of variables in a memory; and computing online gradient values during imaging with the assistance of said stored subset of variables to significantly reduce wave form memory requirements such that a gradient controller can perform required mathematical functions online. By separating the variables describing the selected trajectory, in the coordinate system appropriate to the gradient coils, into variables which are constant from projection to projection and variables which change from projection to projection, the method and device allow a significant fraction of the quantities to be calculated prior to imaging. These calculated values are then stored and used for real-time calculations of parameters which must be changed during the course of the imaging process as projections are stepped through. As a result of this separation of the variables into two groups as described, it is possible to significantly reduce the wave form memory requirements to a size which allows current gradient controllers to perform the required mathematic functions online.

20 Claims, 2 Drawing Sheets

U.S. PATENT DOCUMENTS

2004/0204641 A1* 10/2004 Griffin .................... 600/410

FOREIGN PATENT DOCUMENTS

| EP | 0 678 754 | 10/1995 |
|---|---|---|
| WO | WO 02/059 633 | 8/2002 |

OTHER PUBLICATIONS

Rooney W, Springer C. The molecular environment of intracellular sodium: $^{23}$Na NMR relaxation. *NMR Biomed.* 1991; 4:22.

Pabst T, Sandstede J, Beer M, Kenn W, Greiser A, von Kienlin M, Neubauer s, Hahn D. Optimization of ECG-troggered 3D (23)Na MRI of the human heart. *Magn Reson Med.* 2001;45:164-166.

Constantinides CD, Gillen JS, Boada FE, Pomper MG, Bottomley PA. Human skeletal muscle: sodium MR imaging and quantification- potential applications in exercise and disease. *Radiology* 2000;216:559-568.

Shapiro EM, Borthakur A, Dandora R, Kriss A, Leigh JS, Reddy R. Sodium visibility and quantitation in intact bovine articular cartilage using high field (23) Na MRI and MRS. *J Magn Reson.* 2000;142:24-31.

Lin SP, Song SK, Miller JP, Ackerman JH, Neil JJ. Direct, Longitudinal comparison of $^1$H and $^{23}$Na MRI after transient focal cerebral ischemia. *Stroke* 2001;32:925-932.

Ra J, Hilal Z, Cho Z. A method for in vivo MR imaging of the short T2 component of sodium-23. *Magn. Reson. Med:* 1986;3:296.

Kohler S, Preibisch C, Nittka M, Haase A. Fast three-dimensional sodium imaging of human brain. *MAGMA* 2001;13:63-69.

Boada FE, Gillen JS, Shen GX, Sam Y C, Thulborn KR. Fast Three Dimensional Sodium Imaging. *Mag. Reson. Med.* 1997;37:706-715.

Boada F.E. et al.. "Spectrally weighted twisted projection imaging: reducing T2 signal attenuation effects in fast three-dimensional sodium imaging", Magnetic Resonance in Medicine, vol. 38, No. 6, 1997, pp. 1022-1028.

* cited by examiner

COMPUTER READABLE MAGNETIC RESONANCE METHOD CALCULATING ON-LINE GRADIENTS DURING IMAGING

BACKGROUND OF THE INVENTION

The invention concerns a method and device for magnetic resonance imaging which is particularly suitable for sodium imaging in clinical applications.

The application of sodium MRI in diagnostic radiology and clinical research has been limited due to the technical difficulty of imaging this quadrupolar nucleus. The inherent low concentration of tissue sodium (intra- and extra-cellular concentrations of approximately 10 and 140 mM respectively in the brain[1]), along with very short transverse relaxation times (3 to 8 ms)[2] make this a challenging nucleus to image with adequate signal-to-noise and scan time for clinical use. Despite these constraints, a number of clinical uses of sodium imaging have been reported. The clinical areas most likely to benefit from this technique are in the diagnosis and management of acute stroke[1], myocardial infarction,[3] skeletal muscle disease[4] and osteoarthritis and cartilage degeneration.[5] As sodium imaging has been shown to be a better indicator of ischemic tissue compared with diffusion weighted imaging (DWI) in animal models of stroke[6] there is potential for fast sodium imaging methods to replace the requirement of high-end echoplanar MR scanners capable of DWI for the clinical assessment of acute stroke patients.

Projection imaging (PI) methods[7] and conventional 3D fast gradient echo sequences (FLASH)[8] have previously been adapted to image sodium. Unfortunately, these early PI methods have suffered from inefficient k-space sampling strategies, and gradient echo methods from excessive T2 weighting. Three-dimensional twisted projection-imaging (TPI) sequences with extremely short echo times (TE~0.4 ms) have recently been shown to produce sodium images of diagnostic quality.[9] This approach however does not utilize the potential of the scheme to minimize the noise variance of a sodium image through the uniform sampling of k-space. There is therefore a need for demonstrating how the original concept that resulted in development of the 3D TPI methodology can be used to produce three-dimensional uniform sampling density (USD) k-space trajectories, further improving the efficiency of 3D projection imaging for sodium.

In view of the above aspects of prior art it is the underlying purpose of the present invention to develop a method and device for magnetic resonance imaging which is particularly advantageous for applications involving sodium nuclei, which effects efficient, uniform sampling density with adequate signal to noise ratios for the extracted signals and with scan times which are acceptable for clinical applications.

SUMMARY OF THE INVENTION

The object the invention is achieved using a method and device for magnetic resonance imaging in which a trajectory is selected in phase space and is expressed as a function of variables in a coordinate system suitable for driving the physical gradient coils of an imaging system. The variables in the function describing the selected trajectory are redefined and transformed in such a fashion as to obtain a subset of variables which change as a function of time along the gradient wave forms but which are otherwise constant from projection to projection. The variables which remain constant from projection to projection are then calculated and stored in a memory and the contents of that memory are used for online computing of the gradient values during imaging.

By separating the variables describing the selected trajectory, in the coordinate system appropriate to the gradient coils, into variables which are constant from projection to projection and variables which change from projection to projection, the method and device in accordance with the invention allows a significant fraction of the variables to be calculated prior to imaging. These calculated values are then stored and used for realtime calculations of parameters which must be changed during the course of the imaging process as projections are stepped through. As a result of this separation of the variables into two groups as described, it is possible to significantly reduce the wave form memory requirements to a size which allows current gradient controllers to perform the required mathematic functions online.

In a most preferred application of the invention, the method and device are applied to the magnetic resonance imaging of sodium nuclei. This application is particularly advantageous since sodium nuclei are extremely difficult to image due to the inherently low concentration of quadrupolar (23) sodium in tissue and associated short transverse relaxation times which seriously impairs imaging with good signal to noise ratios in adequate scan times. The method in accordance with the invention is therefore particularly advantageous in this case.

In a particularly preferred application of the method and device, the trajectory selected is a substantially uniform sampling density, three-dimensional trajectory. This embodiment has the advantage, in particular in combination with the imaging of sodium nuclei, of providing a good sampling of k-space using a number of samples which is still small enough to facilitate imaging with good signal to noise ratio in a reasonable amount of scan time.

In a preferred embodiment of the invention, the selected trajectory is a three-dimensional twisted projection imaging sequence with extremely short echo times. This particular application has the advantage of providing efficient use of wave form memory requirements for the gradient controller with a scheme for sampling phase space leading to good signal to noise ratios for reasonable data set sizes.

In a preferred embodiment of the invention, the coordinate system in which the variables and functions for the selected trajectory are expressed is a Cartesian coordinate system. This particular embodiment has the advantage that most gradient systems used in imaging are gradient systems which generate a Cartesian coordinate gradient combination in x, y, and z directions. The Cartesian coordinate system for the selected trajectories is therefore the natural choice for expressing the functions required for the wave form generator of the corresponding gradient.

In a preferred embodiment of the invention, the selected trajectories are twisted spiral trajectories. This particular embodiment has the advantage of providing efficient k-space sampling with increased efficiency and has been shown capable of producing sodium imaging of diagnostic quality in reasonable amounts of imaging time and for reasonable size data sets.

Further features of the invention can be extracted from the figures, the claims, and the associated discussion of a preferred embodiment given below. The preferred embodiment of the invention has exemplary character only and is not an exhaustive enumeration of all possible inventive combinations. The elements disclosed in that embodiment as well as in the claims can also be used in other combinations within the context of the invention so long as those combinations lead to the desired goal of significantly reducing wave form memory for allowing a gradient controller to perform the required mathematical functions online.

DESCRIPTION OF THE PREFERRED EMBODIMENT

One solution to the mathematical condition that allows the constant sampling of k-space represent "twisted spiral" trajectories, similar (but not consistent with) those reported by Boada et al (1997).[9] This solution can be expressed in polar coordinates by $$k_i = (3\gamma G k_0^2 t + k_0^3)^{1/3} \quad (1.1)$$

$$\phi_i = \frac{1}{2\sin\theta_0}\left(\left(\sqrt{(k_i/k_0)^4 - 1}\right) - \tan^{-1}\left(\sqrt{(k_i/k_0)^4 - 1}\right)\right) + \phi_0 \quad (1.2)$$

where k is the spatial frequency vector (equivalent to the radius of the trajectory), $\gamma$ is the gyromagnetic ratio of the imaged nucleus ($^{23}$Na), G is the maximum gradient strength, and $\phi$ and $\theta_0$ are the azimuthal and polar angles, respectively. $k_0$ is the approximate position where the k-space trajectory evolves according to equations 1.1–1.2 and is given by $$k_0 = 2\Delta x p \quad (1.3)$$

where $\Delta x$ and p denote the desired spatial resolution and trajectory twist, respectively.

Figure 2:
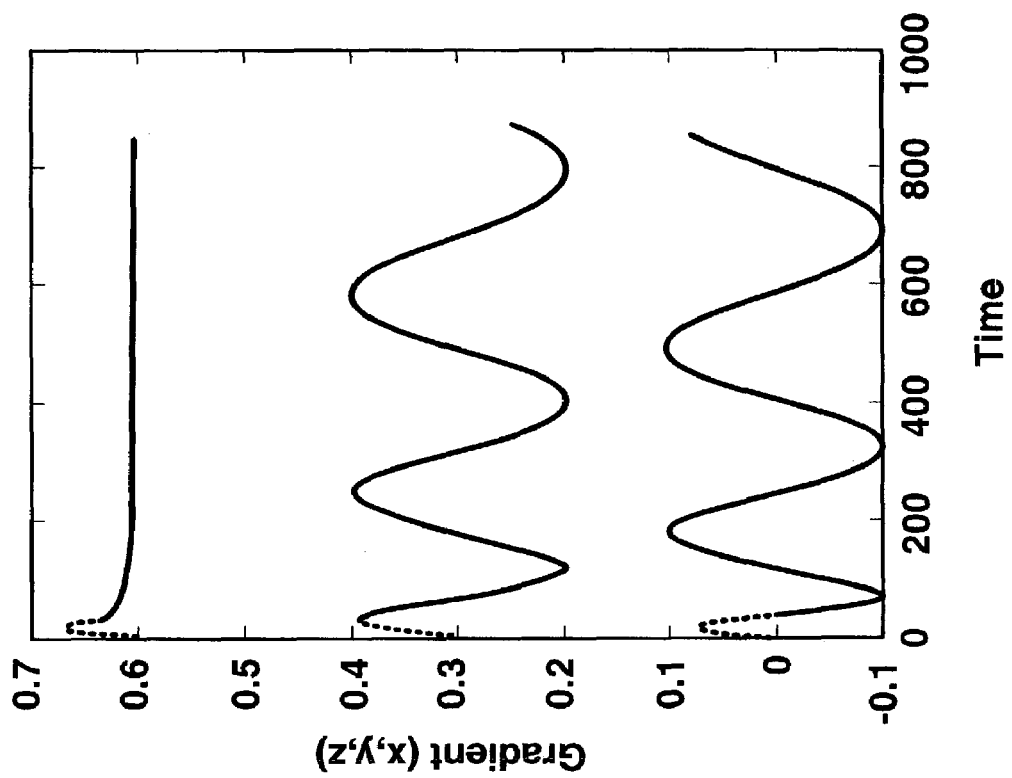
FIG. 2 illustrates the gradient wave form in Cartesian coordinates associated with the phase space trajectory of FIG. 1.
Figure 1:
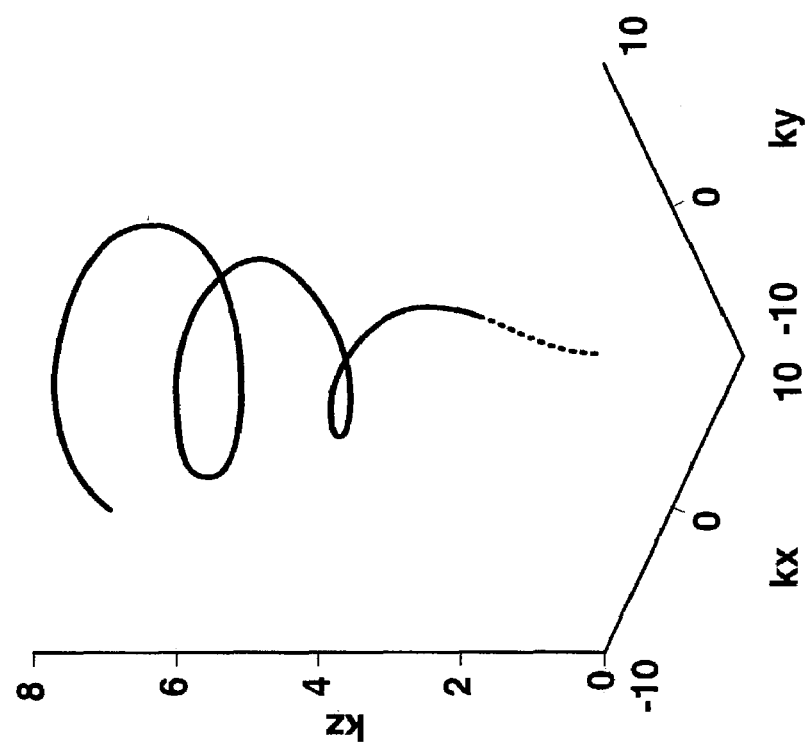
FIG. 1 shows a schematic representation of a twisted spiral phase space trajectory.
Figure 3:
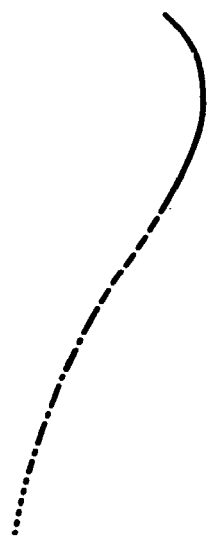
FIG. 3 illustrates an expanded view of the initial portion of the phase space trajectory of FIG. 1 illustrating the ramp up procedure towards the twisted spiral trajectory.
Figure 4:
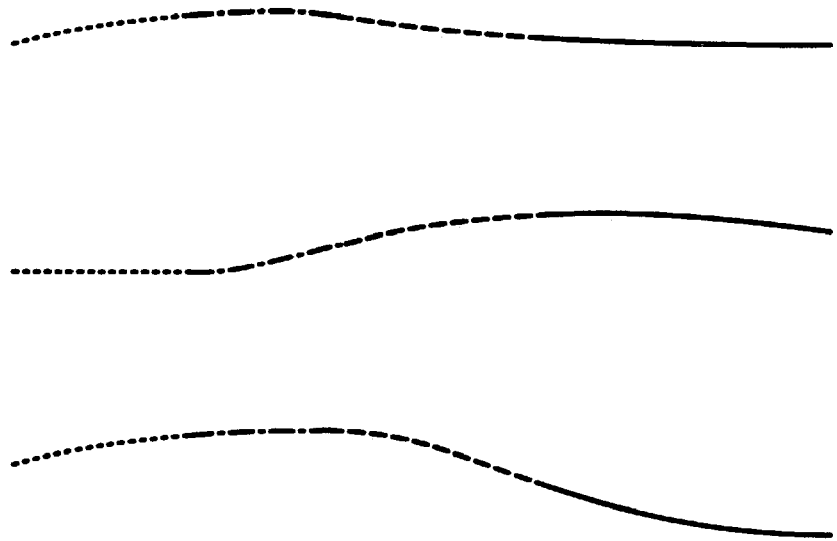
FIG. 4 shows the gradient wave form time dependence corresponding to the ramp up portion of the phase space trajectory illustrated in FIG. 3.

Equations 1.1–1.3 can be used to develop the Uniform Sampling Density (USD) sequence. The k-space trajectories associated with this scheme can be divided into four discrete stages in the region of k space indicated by the dotted line in FIG. 1. As illustrated in FIG. 3, the first three stages depict an initial gradient ramp-up phase (dotted line), a constant radial line (constant gradient, dot-dashed line) and the transition phase from a radial line to the uniform sampling density trajectory or "twisted spiral" (dashed line). The fourth stage begins at this point and $k_i$ and $\phi_i$ start evolving according to equations 1.1–1.2 (solid line). The associated regions of FIG. 3 for the time dependence of the gradients are indicated in FIG. 4.

Using equations 1.1–1.2, Cartesian coordinate equations can be derived and used as input for the USD gradient waveforms. The gradient waveforms associated with these trajectories are expressed below. Note that the three vector equations 1.4–1.6 are dependent on $\theta_0$ (which is constant for a given projection).

where $$Gx_i = \dot{k}_i \sin\theta_0 \cos\phi_i - k_i \dot{\phi}_i \sin\theta_0 \sin\phi_i \quad (1.4)$$

$$Gy_i = \dot{k}_i \sin\theta_0 \sin\phi_i + k_i \dot{\phi}_i \sin\theta_0 \cos\phi_i \quad (1.5)$$

$$Gz_i = \dot{k}_i \cos\theta_0 \quad (1.6)$$

$$\dot{k}_i = \frac{\gamma G k_0^2}{k_i^2} \quad (1.7)$$

$$\dot{\phi}_i = \frac{\gamma G \sqrt{k_i^4 - k_0^4}}{k_i^3 \sin\theta_0} \quad (1.8)$$

As outlined above, the computed gradient waveforms for an 8 mm pixel resolution, trajectory twist p of 0.4, a maximum gradient strength G of 3.2 mT/m, dwell time of 32 μs and a field of view of 220 mm, requires 192,649 points for 503 projections (ie. different values of $\phi$ and $\theta_0$ for a k-space half-sphere) resulting in a waveform memory of approximately 0.4 MB. Even at this modest resolution, the memory requirements are well in excess of available waveform memory on most MRI scanners. One solution to this problem would be to buffer segments of the waveform in and out of the memory during image acquisition. However, there may be some constraints over the practicability of coding this within the pulse program.

An elegant solution to this problem would be to calculate the Cartesian coordinate derived gradient waveforms online during the imaging procedure. This approach suffers from the problem that most MRI scanners do not have the ability to perform mathematical functions such as $\tan^{-1}$ or the square or cube root on the gradient controller. Therefore a new approach is required.

It can be observed that while $\theta_0$ varies between projections it is constant for a given projection. The remaining parameters (such as $k_i$) vary as a function of time along the gradient waveform, but remain constant between projections. Hence the computation of the gradient waveform can be performed in two separate parts. The first part computes and stores in memory those parameters that remain constant between projections prior to the imaging experiment. The second part computes the gradient waveforms online by incorporating $\theta_0$ with the parameters stored in memory.

In addition to the calculation of equations 1.1 and 1.7, the calculations performed prior to the imaging experiment are given by the following transformed, redefined variables:

$$\phi_i = \frac{1}{2}\left(\left(\sqrt{(k_i/k_0)^4 - 1}\right) - \tan^{-1}\left(\sqrt{(k_i/k_0)^4 - 1}\right)\right) \quad (1.9)$$

$$\dot{\phi}_i = \frac{\gamma G \sqrt{k_i^4 - k_0^4}}{k_i^3} \quad (1.10)$$

In comparison to equations 1.2 and 1.8, the equations 1.9 and 1.10 are independent of $\theta_0$, remembering that this parameter varies between projections and thus can be calculated and loaded into an array prior to imaging. The calculations computed online using these transformed variables are then given by:

$$Gx_i = \dot{k}_i \sin\theta_0 \cos\left(\frac{\phi_i}{\sin\theta_0} + \phi_0\right) - k_i\dot{\phi}_i \sin\left(\frac{\phi_i}{\sin\theta_0} + \phi_0\right) \quad (1.11)$$

$$Gy_i = \dot{k}_i \sin\theta_0 \sin\left(\frac{\phi_i}{\sin\theta_0} + \phi_0\right) + k_i\dot{\phi}_i \cos\left(\frac{\phi_i}{\sin\theta_0} + \phi_0\right) \quad (1.12)$$

$$Gz_i = \dot{k}_i \cos\theta_0 \quad (1.13)$$

Using this approach it can be seen that the waveform memory requirements are significantly reduced and that the gradient controller can now perform the mathematical functions online.

REFERENCES

1. Thulborn K R, Gindin T S, Davis D, et al. Comprehensive MR Imaging Protocol for Stroke Management: Tissue sodium concentration as a measure of tissue viability in nonhuman primate studies and in clinical studies. *Radiology* 1999; 213:156–166.
2. Rooney W, Springer C. The molecular environment of intracellular sodium: $^{23}$Na NMR relaxation. *NMR Biomed.* 1991; 4:22.
3. Pabst T, Sandstede J, Beer M, Kenn W, Greiser A, von Kienlin M, Neubauer s, Hahn D. Optimization of ECG-troggered 3D (23)Na MRI of the human heart. *Magn Reson Med.* 2001; 45:164–166.
4. Constantinides C D, Gillen J S, Boada F E, Pomper M G, Bottomley P A. Human skeletal muscle: sodium MR imaging and quantification-potential applications in exercise and disease. *Radiology* 2000; 216:559–568.
5. Shapiro E M, Borthakur A, Dandora R, Kriss A, Leigh J S, Reddy R. Sodium visibility and quantitation in intact bovine articular cartilage using high field (23)Na MRI and MRS. *J Magn Reson.* 2000; 142:24–31.
6. Lin S P, Song S K, Miller J P, Ackerman J H, Neil J J. Direct, Longitudinal comparison of $^1$H and $^{23}$Na MRI after transient focal cerebral ischemia. *Stroke* 2001; 32:925–932
7. Ra J, Hilal Z, Cho Z. A method for in vivo MR imaging of the short T2 component of sodium-23. *Magn. Reson. Med.* 1986; 3:296.
8. Kohler S, Preibisch C, Nittka M, Haase A. Fast three-dimensional sodium imaging of human brain. *MAGMA* 2001; 13:63–69.
9. Boada F E, Gillen J S, Shen G X, Sam Y C, Thulborn K R. Fast Three Dimensional Sodium Imaging. *Mag. Reson. Med.* 1997; 37:706–715.

I claim:
1. A computer readable medium encoded with a computer program configured for carrying out a method of magnetic resonance imaging, the method comprising the steps of:
   a) selecting a trajectory in phase space;
   b) expressing that trajectory as a function of variables in a coordinate system suitable for driving gradient coils of an MR imaging system;
   c) performing variable transformation and redefinition in order to extract a subset of variables that vary as a function of time along gradient wave forms, while being constant from a given projection to another projection;
   d) calculating the subset of variables prior to MR imaging;
   e) storing the calculated subset of variables in a memory; and
   f) computing online gradient values during MR imaging with the assistance of the stored subset of variables in order to significantly reduce the gradient waveform memory requirements such that a gradient controller is capable of performing required mathematical functions online.

2. The computer readable medium of claim 1, wherein sodium nuclei are imaged.

3. The computer readable medium of claim 1, wherein the selected trajectory is a substantially uniform sampling density, three-dimensional trajectory.

4. The computer readable medium of claim 1, wherein the selected trajectory is a three-dimensional twisted projection-imaging sequence with extremely short echo times.

5. The computer readable medium of claim 1, wherein the coordinate system is a Cartesian coordinate system.

6. The computer readable medium of claim 1, wherein the selected trajectories are twisted spiral trajectories.

7. The computer readable medium of claim 6, wherein the spiral trajectories are given by the relationship:

$$k_i = (3\gamma Gk_0^2 t + k_0^3)^{1/3}$$

$$\phi_i = \frac{1}{2\sin\theta_0}\left(\left(\sqrt{(k_i/k_0)^4 - 1}\right) - \tan^{-1}\left(\sqrt{(k_i/k_0)^4 - 1}\right)\right) + \phi_0$$

where k is a spatial frequency vector, equivalent to a radius of the trajectory, γ is a gyro-magnetic ratio of an imaged nucleus, G is a maximum gradient strength, φ is an azimuthal polar angle, $\theta_0$ a polar angle and $k_0$ an approximate position where the trajectory evolves, wherein $k_0$ is equal to 2Δxp, with Δx and p denoting desired spatial resolution and trajectory twist, respectively.

8. The computer readable medium of claim 7, wherein step b) comprises the step of expressing gradient wave forms $Gx_i$, $Gy_i$, $Gz_i$, in a Cartesian coordinate system as follows:

$$Gx_i = \dot{k}_i \sin\theta_0 \cos\phi_i - k_i\dot{\phi}_i \sin\theta_0 \sin\phi_i$$

$$Gy_i = \dot{k}_i \sin\theta_0 \sin\phi_i + k_i\dot{\phi}_i \sin\theta_0 \cos\phi_i$$

$$Gz_i = \dot{k}_i \cos\theta_0$$

where, $$\dot{k}_i = \frac{\gamma G k_0^2}{k_i^2} \quad \text{and}$$

$$\dot{\phi}_i = \frac{\gamma G \sqrt{k_i^4 - k_0^4}}{k_i^3 \sin\theta_0}.$$

9. The computer readable medium of claim 8, wherein the transformed subset of variables in steps c, d, and e are:

$$\phi_i = \frac{1}{2}\left(\left(\sqrt{(k_i/k_0)^4 - 1}\right) - \tan^{-1}\left(\sqrt{(k_i/k_0)^4 - 1}\right)\right)$$

-continued $$\dot{\phi}_i = \frac{\gamma G \sqrt{k_i^4 - k_0^4}}{k_i^3}.$$

10. The computer readable medium of claim 9, wherein step f) comprises the step of online calculation of the following gradient values using the transformed subset of variables:

$$Gx_i = \dot{k}_i \sin\theta_0 \cos\left(\frac{\phi_i}{\sin\theta_0} + \phi_0\right) - k_i\dot{\phi}_i \sin\left(\frac{\phi_i}{\sin\theta_0} + \phi_0\right)$$

$$Gy_i = \dot{k}_i \sin\theta_0 \sin\left(\frac{\phi_i}{\sin\theta_0} + \phi_0\right) + k_i\dot{\phi}_i \cos\left(\frac{\phi_i}{\sin\theta_0} + \phi_0\right)$$

$$Gz_i = \dot{k}_i \cos\theta_0.$$

11. A computer configured for use in a magnetic resonance imaging apparatus and having a computer readable medium encoded with a computer program configured for carrying out a method of magnetic resonance imaging, the computer comprising:
  means for selecting a trajectory in phase space;
  means for expressing that trajectory as a function of variables in a coordinate system suitable for driving gradient coils of an MR imaging system;
  means for performing variable transformation and redefinition in order to extract a subset of variables that vary as a function of time along gradient waveforms and which are constant from a given projection to another projection;
  means for calculating the subset of variables prior to MR imaging;
  means for storing the calculated subset of variables in a memory; and
  means for computing online gradient values during MR imaging with the assistance of the stored subset of variables in order to significantly reduce the gradient waveform memory requirements such that a gradient controller is capable of performing required mathematical functions online.

12. The computer of claim 11, wherein sodium nuclei are imaged.

13. The computer of claim 11, wherein the phase-space trajectory is a substantially uniform sampling density, three-dimensional trajectory.

14. The computer of claim 11, wherein the phase-space trajectory is a three-dimensional twisted projection-imaging sequence with extremely short echo times.

15. The computer of claim 11, wherein the coordinate system is a Cartesian coordinate system.

16. The computer of claim 11, wherein the phase-space trajectory is a twisted spiral trajectory.

17. The computer of claim 16, wherein the spiral trajectory is given by the relationship:

$$k_i = (3\gamma G k_0^2 t + k_0^3)^{1/3}$$

$$\phi_i = \frac{1}{2\sin\theta_0}\left(\left(\sqrt{(k_i/k_0)^4 - 1}\right) - \tan^{-1}\left(\sqrt{(k_i/k_0)^4 - 1}\right)\right) + \phi_0$$

where k is a spatial frequency vector equivalent to a radius of the trajectory, γ is a gyro-magnetic ratio of an imaged nucleus, G is a maximum gradient strength, φ is an azimuthal polar angle, $\theta_0$ a polar angle and $k_0$ an approximate position where the trajectory evolves, wherein $k_0$ is equal to 2Δxp, with Δx and p denoting desired spatial resolution and trajectory twist, respectively.

18. The computer of claim 17, wherein gradient wave forms $Gx_i$, $Gy_i$, $Gz_i$, are defined in a Cartesian coordinate system having the following functional relationships prior to use of the transformed set of variables:

$Gx_i = \dot{k}_i \sin\theta_0 \cos\phi_i - k_i \dot{\phi}_i \sin\theta_0 \sin\phi_i$ $Gy_i = \dot{k}_i \sin\theta_0 \sin\phi_i + k_i\dot{\phi}_i \sin\theta_0 \cos\phi_i$ $Gz_i = \dot{k}_i \cos\theta_0$ where, $$\dot{k}_i = \frac{\gamma G k_0^2}{k_i^2} \quad \text{and}$$

$$\dot{\phi}_i = \frac{\gamma G \sqrt{k_i^4 - k_0^4}}{k_i^3 \sin\theta_0}.$$

19. The computer of claim 18, wherein the following transformed subset of variables is extracted:

$$\phi_i = \frac{1}{2}\left(\left(\sqrt{(k_i/k_0)^4 - 1}\right) - \tan^{-1}\left(\sqrt{(k_i/k_0)^4 - 1}\right)\right)$$

$$\dot{\phi}_i = \frac{\gamma G \sqrt{k_i^4 - k_0^4}}{k_i^3}.$$

20. The computer of claim 19, wherein the following gradient values are calculated online using the transformed set of variables:

$$Gx_i = \dot{k}_i \sin\theta_0 \cos\left(\frac{\phi_i}{\sin\theta_0} + \phi_0\right) - k_i\dot{\phi}_i \sin\left(\frac{\phi_i}{\sin\theta_0} + \phi_0\right)$$

$$Gy_i = \dot{k}_i \sin\theta_0 \sin\left(\frac{\phi_i}{\sin\theta_0} + \phi_0\right) + k_i\dot{\phi}_i \cos\left(\frac{\phi_i}{\sin\theta_0} + \phi_0\right)$$

$$Gz_i = \dot{k}_i \cos\theta_0.$$

* * * * *